(12) United States Patent
Arvin et al.

(10) Patent No.: US 7,587,302 B2
(45) Date of Patent: Sep. 8, 2009

(54) GRAPHIC INTERACTIVE METHOD TO REORDER SEQUENTIAL DATA VALUES ON GRAPHIC OBJECTS

(75) Inventors: Scott A. Arvin, New Boston, NH (US); Paul J. McArdle, Bow, NH (US); David J. Plunkett, Henniker, NH (US); Marc W. Schindewolf, Hopkinton, NH (US)

(73) Assignee: Autodesk, Inc., San Rafael, CA (US)

( * ) Notice: Subject to any disclaimer, the term of this patent is extended or adjusted under 35 U.S.C. 154(b) by 532 days.

(21) Appl. No.: 11/345,100

(22) Filed: Jan. 31, 2006

(65) Prior Publication Data

US 2007/0179976 A1    Aug. 2, 2007

(51) Int. Cl.
G06F 17/50 (2006.01)
G06F 17/30 (2006.01)
(52) U.S. Cl. .................... 703/2; 345/420; 707/102
(58) Field of Classification Search .......... 703/2, 703/5, 7, 8; 707/102; 345/420
See application file for complete search history.

(56) References Cited

U.S. PATENT DOCUMENTS

| | | | |
|---|---|---|---|
| 5,268,998 A * | 12/1993 | Simpson | 345/427 |
| 5,557,537 A | 9/1996 | Normann et al. | |
| 5,856,828 A | 1/1999 | Letcher, Jr. | |
| 6,052,691 A | 4/2000 | Ardoin et al. | |
| 6,426,745 B1 | 7/2002 | Isaacs et al. | |
| 6,614,430 B1 * | 9/2003 | Rappoport | 345/420 |
| 6,629,065 B1 | 9/2003 | Gadh et al. | |
| 6,799,463 B2 | 10/2004 | Fields et al. | |
| 6,816,819 B1 | 11/2004 | Loveland | |
| 6,859,768 B1 | 2/2005 | Wakelam et al. | |
| 7,246,044 B2 | 7/2007 | Imamura et al. | |
| 7,292,908 B2 | 11/2007 | Borne et al. | |
| 2001/0033281 A1 * | 10/2001 | Yoshida et al. | 345/420 |
| 2005/0038636 A1 | 2/2005 | Wakelam et al. | |
| 2005/0131924 A1 | 6/2005 | Jones | |
| 2005/0209831 A1 | 9/2005 | Jungreis et al. | |
| 2006/0143220 A1 * | 6/2006 | Spencer, Jr. | 707/102 |
| 2006/0208169 A1 | 9/2006 | Breed et al. | |
| 2006/0230351 A1 * | 10/2006 | Stehle et al. | 715/700 |
| 2007/0063378 A1 | 3/2007 | O'Donoghue | |
| 2007/0091119 A1 | 4/2007 | Jezyk et al. | |

(Continued)

FOREIGN PATENT DOCUMENTS

EP          1223520          7/2002

(Continued)

OTHER PUBLICATIONS

U.S. Appl. No. 11/619,565, filed Jan. 3, 2007, Kfouri et al.

(Continued)

*Primary Examiner*—Thai Phan
(74) *Attorney, Agent, or Firm*—Fish & Richardson P.C.

(57) ABSTRACT

A reordering tool for sequentially reordering data values assigned to graphical objects in a CAD model is described. The reordering tool can be a software application or a tool included in a software application. The reordering tool can have one or more graphical user interfaces configured to receive input from a user and present information to a user prior to reordering data values of the objects.

15 Claims, 7 Drawing Sheets

U.S. PATENT DOCUMENTS

| | | |
|---|---|---|
| 2007/0174026 A1 | 7/2007 | Mangon et al. |
| 2007/0174027 A1 | 7/2007 | Moiseyev |
| 2007/0179759 A1 | 8/2007 | Mangon |
| 2007/0219764 A1 | 9/2007 | Backe |
| 2007/0282792 A1 | 12/2007 | Bailly et al. |
| 2008/0077364 A1 | 3/2008 | Wakelam et al. |

FOREIGN PATENT DOCUMENTS

| | | |
|---|---|---|
| WO | WO 02/08975 | 1/2002 |
| WO | WO 03/100555 | 12/2003 |

OTHER PUBLICATIONS

U.S. Appl. No. 11/460,524, filed Jul. 27, 2006, Kfouri et al.

U.S. Appl. No. 11/695,535, filed Apr. 2, 2007, Culver et al.

Autodesk, Inc., International Search Report and the Written Opinion of the International Searching Authority dated Aug. 31, 2007 for International Patent Application No. PCT/US2007/064009 filed Mar. 14, 2007.

ESS: "Klima2000 Handbuch—Schritt für Schritt (Excerpt: Kapitel 10)", KLIMA 2000, 1999, pp. 10-1 to 10-45.

Parametric Technology Corporation, "Getting Started with Pro/Engineer(R) 2001," 2001, Parametric Technology Corporation, pp. 1-192.

Autodesk Inc., "AutoCAD Architectural Desktop (tm) User's Guide," 1999, Autodesk Inc., Release 2, pp. i-xxiv, 1-8; 219-296.

Ramon F. Sarraga, "Modifying CAD/CAM surfaces according to displacements prescribed at a finite set of points," Computer-Aided Design, vol. 36, Issue 4, Feb. 2004, pp. 343-349.

International Search Report for PCT Application No. PCT/US08/58746, dated Aug. 15, 2008.

\* cited by examiner

GRAPHIC INTERACTIVE METHOD TO REORDER SEQUENTIAL DATA VALUES ON GRAPHIC OBJECTS

TECHNICAL FIELD

This invention relates to data storage and manipulation.

BACKGROUND

Computer-aided design (CAD) systems have become an important design tool used by designers, engineers and architects to build graphical models and drawings that simulate practical mechanical, electrical and architectural components for various applications. An advancement and replacement to the traditional hand-drawn process, a CAD system provides interfacing modules for creating graphical objects while delivering precise and accurate measurement and dimensions of these objects to users. With appropriate data entered into interfacing modules, a CAD system can further provide efficient product realization and visualization, structural analysis, and manufacturing development.

During a design stage, numbering graphical objects is sometimes necessary. Conventionally, to establish a sequence among a group of objects, a user manually assigns an identifier (e.g., numeric, alpha-numeric, etc.) in the form of text to each object. An example of using this technique includes numbering rooms or floors of a building.

However, conventional CAD systems often lack numbering control and management, and renumbering multiple objects is often inevitable when the sequence is interrupted. From a user's perspective, renumbering objects can be a time consuming and tedious operation. For example, if a hotel room in a CAD model representing a hotel floor is erroneously assigned with an inaccurate room number, a user endures the labor-intensive challenge of manually reassigning the room with a correct room number, as well reassigning room numbers to multiple other rooms on the same floor, so as to restore a specific sequence. The tediousness of the task further magnifies the possibility of incurring inadvertent errors, and potentially causing significant problems during actual implementation of the design represented by the CAD model.

SUMMARY

In some embodiments, a method of reordering data values of objects is disclosed. A user can specify a start value, the data value assigned to a selected object, and an incremental value at which an object succeeding the selected object is applied with a data value of a preceding object. In one implementation, to enhance graphical visualization, the user also may specify a text height of the data value of each graphical object, and a node size of a node functionally representing a corresponding graphical object.

In some implementations, a user can initiate a reordering of the data values assigned to Space objects having the number property. A first drop-down menu can be provided to facilitate receiving an input for selecting a property set, which in turn facilitates selecting a particular set of graphical objects having similar structural traits, because, for example, only Space objects in this implementation can have the "RoomObjects" property set applied, which property set is selected by the user. A second drop-down menu can be provided to facilitate receiving an input selecting a specific property from the RoomObjects property set to which a selected tool (e.g., a reordering tool) will be applied.

In some implementations, responsive to the selection of inputs, drop down menus can be provide to facilitate the identification of a selected group of graphical objects, and initiate a particular operation. The renumber tool may initially identify a set of graphical objects having the selected property set applied or capable of having the property set applied previously specified. The identification process may be followed by a display or high-lighting of the graphical objects having the common property set or not having the common property set but to which the property set could be applied, while isolating graphical objects to which the selected property set cannot be applied.

In some implementations, a method of sequentially ordering data values assigned to graphical objects in a computer-aided design includes: receiving a set of graphical objects in a computer-aided design, one or more of the graphical objects having an originally assigned data value and at least some of the originally assigned data values conforming to a sequence and incremented by a predetermined incremental amount; receiving a selection of a graphical object included in the set of graphical objects and modifying the originally assigned data value of the graphical object; and in response to receiving the selection and modification, modifying the originally assigned data values of one or more of the graphical objects in the set, such that all assigned data values succeeding the originally assigned data value of the selected graphical object conform to the sequence and are incremented by the predetermined incremental amount.

In some implementations, a method of ordering data values assigned to graphical objects in a computer-aided design includes: sequentially assigning a data value to each graphical object in a set of graphical objects; displaying graphical links between the graphical objects in accordance with their sequentially assigned data values; receiving a user input selecting a graphical link between two graphical objects; in response to receiving said user input, trading the assigned data values between the two graphical objects; and modifying the displayed graphical links to maintain the graphical links in accordance with the sequentially assigned data values, including the traded assigned data values.

In some implementations, a method of sequentially ordering data values assigned to graphical objects in a computer-aided design includes: receiving a set of graphical objects in a computer-aided design, each graphical object having an originally assigned data value, where the originally assigned data values are sequentially ordered and incremented by a predetermined incremental amount; deleting at least one graphical object from the set of graphical objects; and modifying the data values of the graphical objects having data values succeeding the data value of the deleted graphical object, such that the originally assigned data values of the set of graphical objects excluding the deleted graphical object remain sequentially ordered and incremented by the predetermined incremental amount.

In some implementations, a method of sequentially ordering data values assigned to graphical objects in a computer-aided design includes: receiving a set of graphical objects in a computer-aided design, each graphical object having an originally assigned data value, where the originally assigned data values are ordered according to a sequence and incremented by a predetermined incremental amount; adding at least one graphical object to the set of graphical objects, the added graphical object not having an originally assigned data value; receiving a user input selecting an insertion point within the sequence for the added graphical object; and based on the insertion point within the sequence, assigning a data value to the added graphical object and modifying the data value of one or more of the graphical objects having data values equal to or succeeding the data value of the added graphical object, such that the assigned data values of the set of graphical objects including the added graphical object remain sequentially ordered and incremented by the predetermined incremental amount.

In some implementations, a method of sequentially ordering data values assigned to graphical objects in a computer-aided design includes: specifying an individual property or a property contained in a property set; receiving a set of graphical objects in a computer-aided design and identifying graphical objects having the specified property, where each of the identified graphical objects have an originally assigned data value for the specified property and at least some of the originally assigned data values conform to a sequence and incremented by a predetermined incremental amount; receiving a selection of an identified graphical object and modifying the originally assigned data value of the identified graphical object; and in response to receiving the selection and modification, modifying the originally assigned data values of one or more of the identified graphical objects, such that all assigned data values succeeding the originally assigned data value of the identified graphical object conform to the sequence and are incremented by the predetermined incremental amount.

In some implementations, a method of sequentially ordering data values assigned to graphical objects in a computer-aided design includes: receiving a set of graphical objects in a computer-aided design each having an originally assigned data value or capable of having an assigned data value, where each data value conforms to a sequence; selecting a first graphical object included in the set of graphical objects and assigning a data value or modifying the originally assigned data value of the first graphical objects; selecting a second graphical object included in the set of graphical objects and assigning a data value or modifying the originally assigned data value of the second graphical objects; and if necessarily, selecting one or more objects and modifies a data value of the selected object until the sequence is restored.

In some implementations, a method of sequentially ordering data values assigned to graphical objects in a computer-aided design includes: receiving a set of graphical objects in a computer-aided design, one or more of the graphical objects having an originally assigned data value; receiving a user input defining a sequence including a defined start data value and a defined increment value; receiving a user input selecting a first graphical object included in the set of graphical objects and assigning the start data value to the selected first graphical object; receiving a user input selecting a next graphical object and assigning a data value to the next graphical object based on the assigned data value of the previously selected graphical object and the defined increment value; and repeating the above step until a user input to terminate the process is received.

Particular implementations of the invention can be implemented to realize one or more of the following advantages. A reordering tool implemented, for example, in a CAD software application, is provided that allows a user to efficiently and accurately reassign sequential data values to graphical objects. A user can select parameters for reordering, and easily make changes to a sequence, add or delete graphical objects, and swap data values between graphical objects. A visual display traced between sequentially ordered graphical objects allows a user to easily identify target graphical objects for reassigning data values.

Objects and their assigned parameters may be quickly and uniformly modified by the present CAD system with a single command from the user. Accordingly, parameters reordering can be executed to a CAD drawing or model without requiring the user to manually modify the assigned parameter of each object.

As will be readily apparent from the description to follow, the present invention advantageously enables a designer to be able to efficiently reuse an assigned number from one object to another object. In particular, the present invention enables a user to be able to explore the sequential relationship between objects, thereby allowing the user to leverage on the reuse support offered by the present invention.

The details of one or more embodiments of the invention are set forth in the accompanying drawings and the description below. Other features, aspects, and advantages of the invention will become apparent from the description, the drawings, and the claims.

DRAWINGS

Like reference numbers and designations in the various drawings indicate like elements.

DETAILED DESCRIPTION

Figure 1:
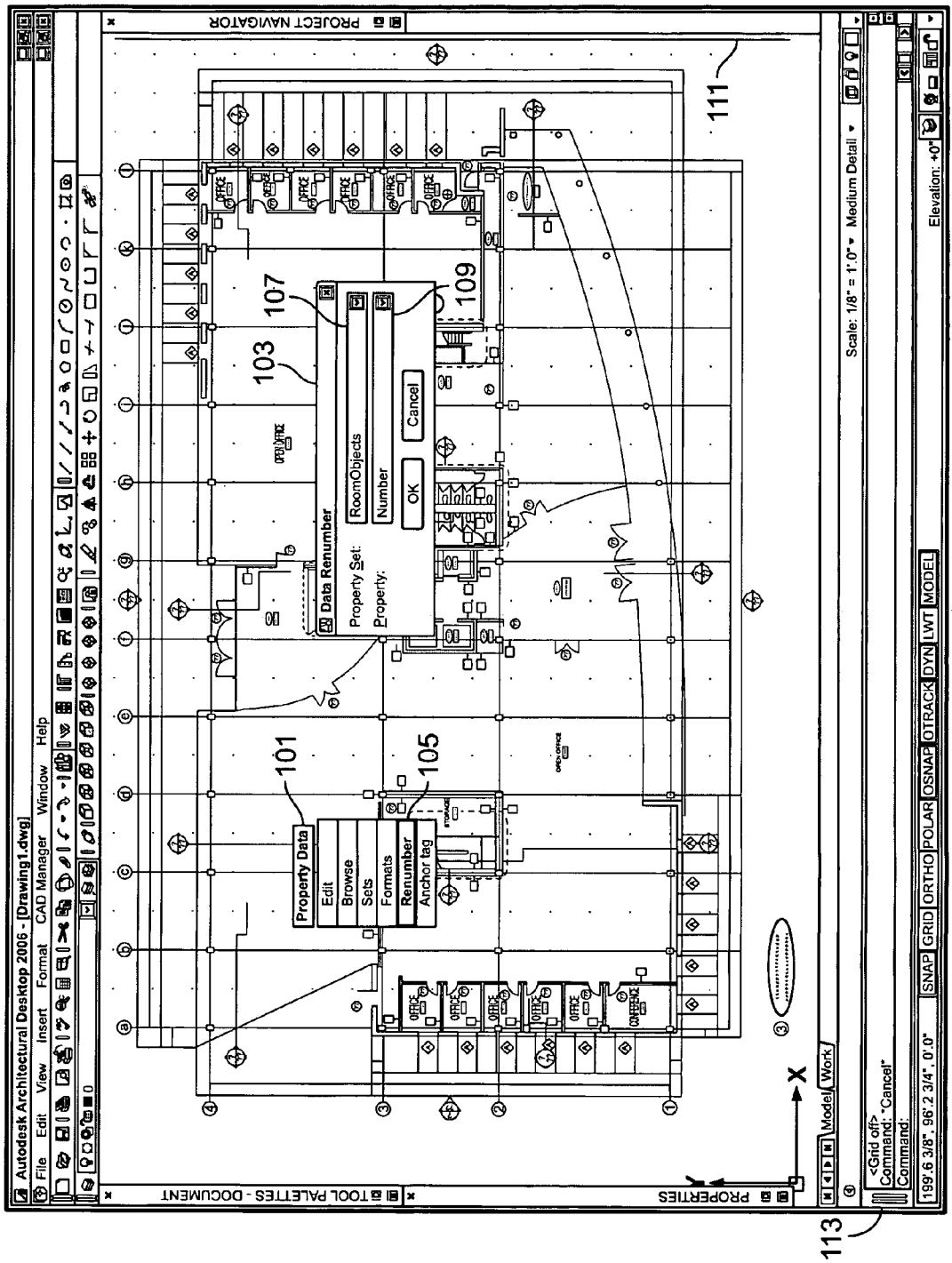
FIG. 1 illustrates an exemplary dialog box through which input(s) may be received for determining objects to which values are to be assigned.

Referring to FIG. 1, a screen shot showing a graphical user interface of a computer-aided design (CAD) application is shown. The CAD application can be, for example, AutoCad®, Autodesk Architectural Desktop® or Autodesk Building Systems®, available from Autodesk, Inc., in San Rafael, Calif., or another CAD application or other software application with CAD functionality. The view of a CAD model is merely exemplary, for illustrative purposes. Various additional views may be used to aid in representing CAD models such as, but not limited to, orthographic views, projected views, details views, sections views and so forth, and views of the CAD model illustrated in the drawing are not restricted to only those shown.

Renumber Tool

A reordering tool for sequentially reordering data values assigned to graphical objects in a CAD model shall be described. The reordering tool can be a software application or a tool included in a software application, e.g., a CAD software application, and can be implemented in software, hardware or firmware. The reordering tool can have one or more graphical user interfaces configured to receive input from a user and present information to a user, for example, menus, palettes, and dialog boxes.

Referring again to FIG. 1, in the implementation shown, the data values to be associated with graphical objects are numerical, and the reordering tool is referred to as a "renumber tool". In other implementations, the data values are not numeric, and can be, for example, alphabetic, alphanumeric, symbolic, or otherwise. For illustrative purposes, the reordering tool shall be described herein in the context of a renumber tool applying to numeric data values, but it should be understood that a tool applying to numeric data values is merely illustrative and not limiting.

In one implementation, the renumber tool is accessible to a user by selecting the "renumber" 105 item in a Property Data panel 101. Other means of invoking the renumber tool are possible including by hotkeys, keystrokes, or other selection means. The Property Data panel 101 is shown overlying a plan view of a CAD model representing, for illustrative purposes, a floor of a building including multiple rooms, some of which are assigned room numbers, i.e., data values. In one implementation, the Property Data panel 101 can be retrieved and accessed by means of graphical user interface modules (e.g., graphics icons) provided by a CAD software application executing the renumber tool, by means of user input device (e.g., mouse, keyboard or a tablet pc pen), or through the input command box 113. The Property Data panel 101 can display various available tools, and interactively receive a selection from a user (e.g., by clicking on a particular tool) if a particular operation is desired. For illustrative purposes, tools included in the Property Data panel 101 include edit, browse, sets, formats, renumber and anchor tag. The operation of the renumber tool 105 is described further below.

In the example shown, upon selecting the renumber tool 105 from the Property Data panel 101, one or more dialog boxes may be generated. A dialog box may be in the form of a graphical user interface, such as, but not limited to, a dialog box generated in the Windows® operating systems. The dialog box may include various drop-down menus to facilitate receiving inputs for executing a selected operation. In this implementation, a dialog box 103 is generated, and includes a first drop-down menu 107 and a second drop-down menu 109 that may be used to facilitate receiving inputs for performing a particular operation among a selected group of graphical objects.

Property Set and Property of Objects

In one implementation, the data value assigned to an object is a value of a "property" of the object. In the example discussed in this application (which is illustrative and not limiting), the data value corresponds to a room number. Room number corresponds to the "number" property assigned to a type of object referred to as a "Space object". That is, space objects can have the number property applied to them. In the particular implementation described, the number property is included in a property set entitled "RoomObjects". A space object is an object that can have the RoomObjects property set applied, including the number property contained therein.

Referring to FIG. 1, a user can initiate a reordering of the data values assigned to Space objects having the number property applied as follows, in one particular implementation. It should be understood that in other implementations, other user interfaces and instructions can be used to initiate using the reorder tool to reorder data values corresponding to the number property, or any other property with a data value that can be sequentially ordered. The discussion to follow is merely a description of one possible implementation.

A first drop-down menu 107 facilitates receiving an input for selecting a property set, which in turn facilitates selecting a particular set of graphical objects having similar structural traits, because, for example, only Space objects in this implementation can have the "RoomObjects" property set applied, which property set is selected by the user. The second drop-down menu 109 facilitates receiving an input selecting a specific property from the RoomObjects property set to which a selected tool (e.g., a reordering tool) will be applied. In this example, the user selects the "number" property. That is, the user has selected to reorder the room numbers for a set of Space objects.

Responsive to the selection of inputs, drop down menus 107 and 109 facilitate the identification of a selected group of graphical objects, and initiate a particular operation. The renumber tool may initially identify a set of graphical objects (i.e., Space objects) having the selected property set applied or capable of having the property set applied (i.e., "RoomObjects" property set) previously specified (e.g., in the dialog box 103). The identification process may be followed by a display or high-lighting of the graphical objects having the common property set or not having the common property set but to which the property set could be applied, while isolating (e.g., visually hiding) graphical objects to which the selected property set cannot be applied.

In this implementation, when an object, e.g., a Space object, is created by the user, the user can apply the RoomObjects property set and the number property, either assigning a data value to the number property or allowing a default value, e.g., 0, to be assigned. However, the user does not have to apply the property set. Therefore, there can be one or more Space objects that do not have the RoomObjects property set applied, yet they are objects to which the property set can be applied. These Space objects are included in the identification of graphical objects have the selected property and property set, even though the property set has not yet been applied. In one implementation, the renumber tool can prompt the user to apply the property set of that object, e.g., via a separate user interface.

While "RoomObjects" as a property set has been illustrated, other property sets including, but not limited to, property sets related to doors, windows or corridors also may be provided as inputs under the first drop-down menu 107. A CAD model representing something other than a building, for example, representing a mechanical device, may have property sets including elements found in the device, e.g., gears, screws, bolts, etc. That is, there are many possible values that can be included in the property set drop-down menu, depending, for example, on the type of structure or device being represented by the CAD model, and other factors.

Parameters of the Renumber Tool

Figure 2:
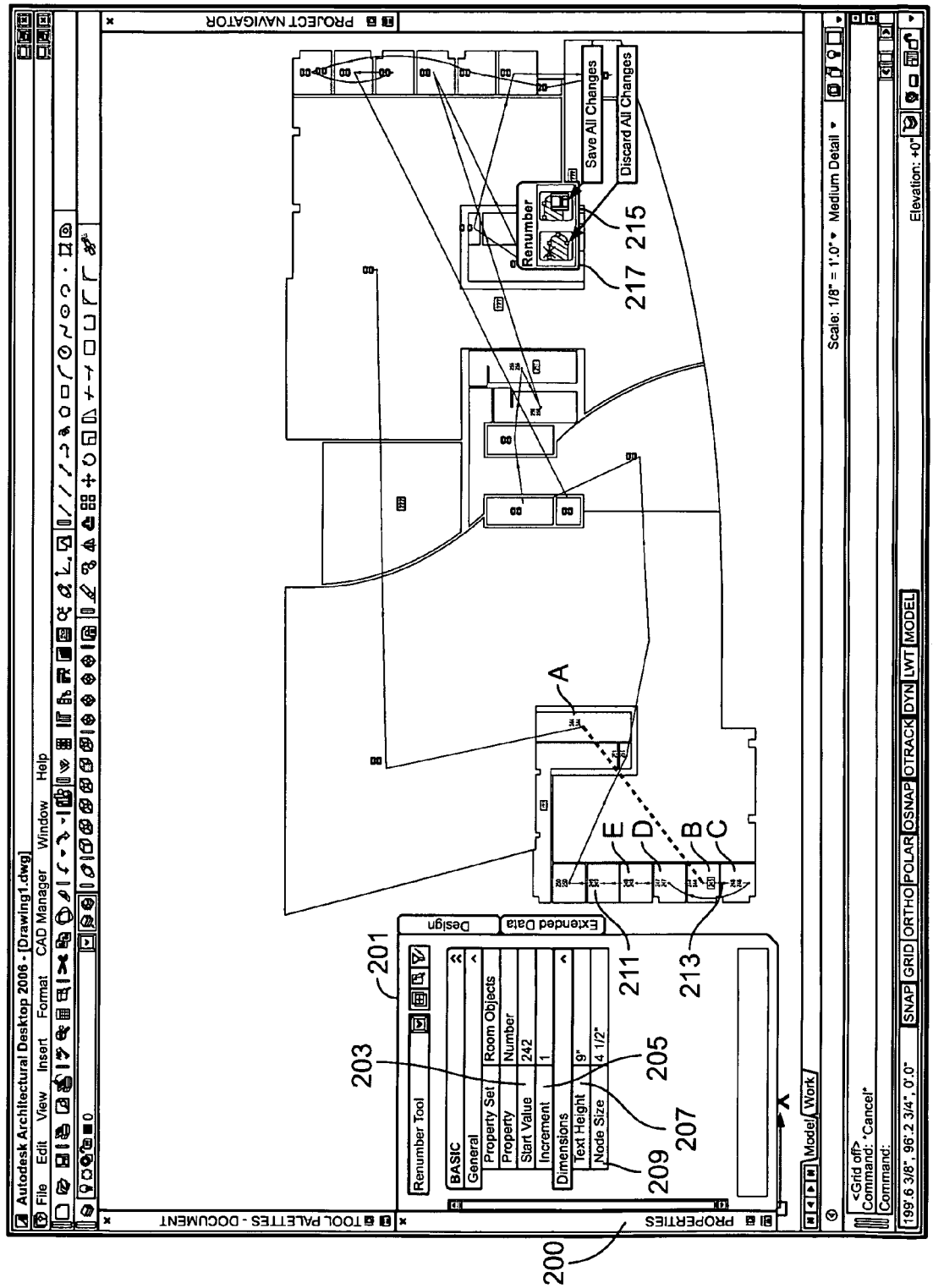
FIG. 2 shows a palette for determining the initial parameters of a particular reordering operation.

FIG. 2 shows a palette 201 for setting the initial parameters for use by the renumber tool. Referring to FIG. 2, when inputs, for example, "RoomObjects" and "Number", are respectively selected from the first drop-down menu 107 and second drop-down menu 109, a palette 201 may be expanded from the side panel 200, and displayed to the user. In the implementation shown, a user can specify a start value 203, the data value assigned to a selected object, and an incremental value 205 at which an object succeeding the selected object is applied with a data value of a preceding object.

In one implementation, to enhance graphical visualization, the user also may specify a text height 207 of the data value of each graphical object, and a node size 209 of a node functionally representing a corresponding graphical object. For instance, modifying a text height and node size of object "D" would respectively change the text height of the data value "247" assigned to object "D".

As previously discussed in the Background, reordering data values assigned to graphical objects can be visually difficult and manually challenging. However, the renumber tool facilitates the process for a user. In addition to assigning numbers to graphical objects that were previously not numbered, the renumber tool can be used to change a number assignment associated with one or more graphical objects. That is, in one implementation, after receiving a set definition (e.g., a set of graphical objects responsive to a user's identified group of graphical objects having a selected property set), and specified parameters (e.g., start value and incremental value), the renumber tool can alter one or more originally assigned data values of one or more of the identified graphical objects in accordance with the sequence specified (e.g. specified in the palette 201).

For example, if the start value and the incremental value have been respectively set as "242" and "1" in the palette 201, the originally assigned data value of a selected graphical object may be modified to "242", and at least one or more assigned data values succeeding the originally assigned data value of the selected graphical object may be modified to "243", "244", "245", "246" etc . . . , such that the data values of every identified object conforms to the defined sequence. Similarly, if the start value and the incremental value have been respectively set as "242" and "2" in the palette 201, the originally assigned data value of a selected graphical object may be modified to "242", and at least one or more data values succeeding the originally assigned data value of the selected graphical object may be modified to "244", "246", "248", "250" etc. Each subsequent data value is determined by applying the incremental value to a preceding data value so that each identified object is allocated with a unique data value conforming to the specified sequence.

In one implementation, if desired, a user may graphically hover and highlight a set of graphical objects for which data value reordering is desired. For example, using a select tool, the user may hover over and manually highlight a room (e.g., by clicking with a mouse). The user also can select multiple rooms by using conventional key strokes, such as holding the control key on a keyboard. Graphical objects whose data values are to be reordered may be displayed with a unique color so as to distinguish from other non-selected graphical objects.

Tracing Techniques for Maintaining Relationships Between Objects

When renumbering graphical objects that have been previously numbered, the renumber tool can take into consideration relative relationships between the previously numbered objects. For example, a drawing may include 7 objects that have been numbered 1-7 (i.e., objects 1-7). Two new objects may be added to the drawing (object 0 and object 8). The user may invoke the renumber tool to number (and effectively renumber) all of the objects in the drawing, using for example a tracing technique. A tracing technique can systematically and directionally link all of the graphical objects (or linking nodes representing the corresponding graphical objects) to one another based on their originally assigned data value(s). For example, numbered objects 1-7 in the room can be linked 1-2, 2-3, etc. When the renumber tool is called (e.g., a renumber operation is invoked for the room and a start parameter is selected to indicate that the sequence should start with the number 1, go by ones, and start with object 0), all the graphical objects can be numbered (or renumbered as appropriate). In this example, object 0 would be assigned the number 1, object 1 reassigned the number 2, and so on. In another example, line 211 represents a directional link between object "D" and object "E", indicating a sequence flowing from object "D" to object "E" based on their assigned data values (i.e., from "247" to "248"). Once reordering is complete and changes are reflected on the drawing, the user may save or discard the changes, for example, through applet 215 or applet 217, respectively.

In some implementations, once changes are saved, all old and new data values are displayed with a common graphical representation (e.g., textually displayed in green). Any further modification to a data value of an object alters the graphical representation of that data value so that a user can visually identify and distinguish the new data value after the drawing was last saved. For example, data values of objects "A" through "E" are displayed in green after the drawing is saved. The user immediately modifies the data value of object "A." As a result, the renumber tool displays the new data value of object "A" in red, while the color of other unchanged data values remains in green. Therefore, the user is provided a useful visual cue as to what data values have been changed before making a decision to save or discard the changes.

Overlapping Links

As discussed previously, a tracing technique can systematically and directionally visually link all of the graphical objects (or linking nodes) to one another based on their originally assigned data value(s). Based on the directions indicated by the directional links, a user can determine the relationships between the objects interconnected by the directional links. For example, if a directional link pointing from a first object to a second object is generated, the user can properly infer that the first object has a lower data value than that of the second object.

However, one problem associated with the tracing technique relates to overlapping links. For example, referring to FIG. 3 in conjunction with FIG. 2, link 213 conveniently interconnects object "B" to object "C". Concurrently, a separate directional link from object "C" to object "D", if present, would overlap with link 213 in order to connect to object "D".

Accordingly, in some implementations, the renumber tool can detect overlapping links and correct the shape of a link as appropriate to avoid this problem. For example, the renumber tool can appropriately select a link having a suitable shape to avoid being graphically drawn over link 213. In the implementation depicted, an arc is chosen to effectuate this objective. Although only lines and arcs have been shown as directional links, graphical links or indicators having other shapes, dimensions or colors also may be employed.

In some implementations, the directional links can be invoked automatically by the renumber tool once the data values or relationships between the objects are defined or assigned. Alternatively, the directional links can be generated by the user prior to assigning data values or modifying the relationships between the objects. If desired, the user also can manually choose a particular directional link, and configure the shape of the directional link to a desired pattern.

Inconsistency Checking

Figure 3:
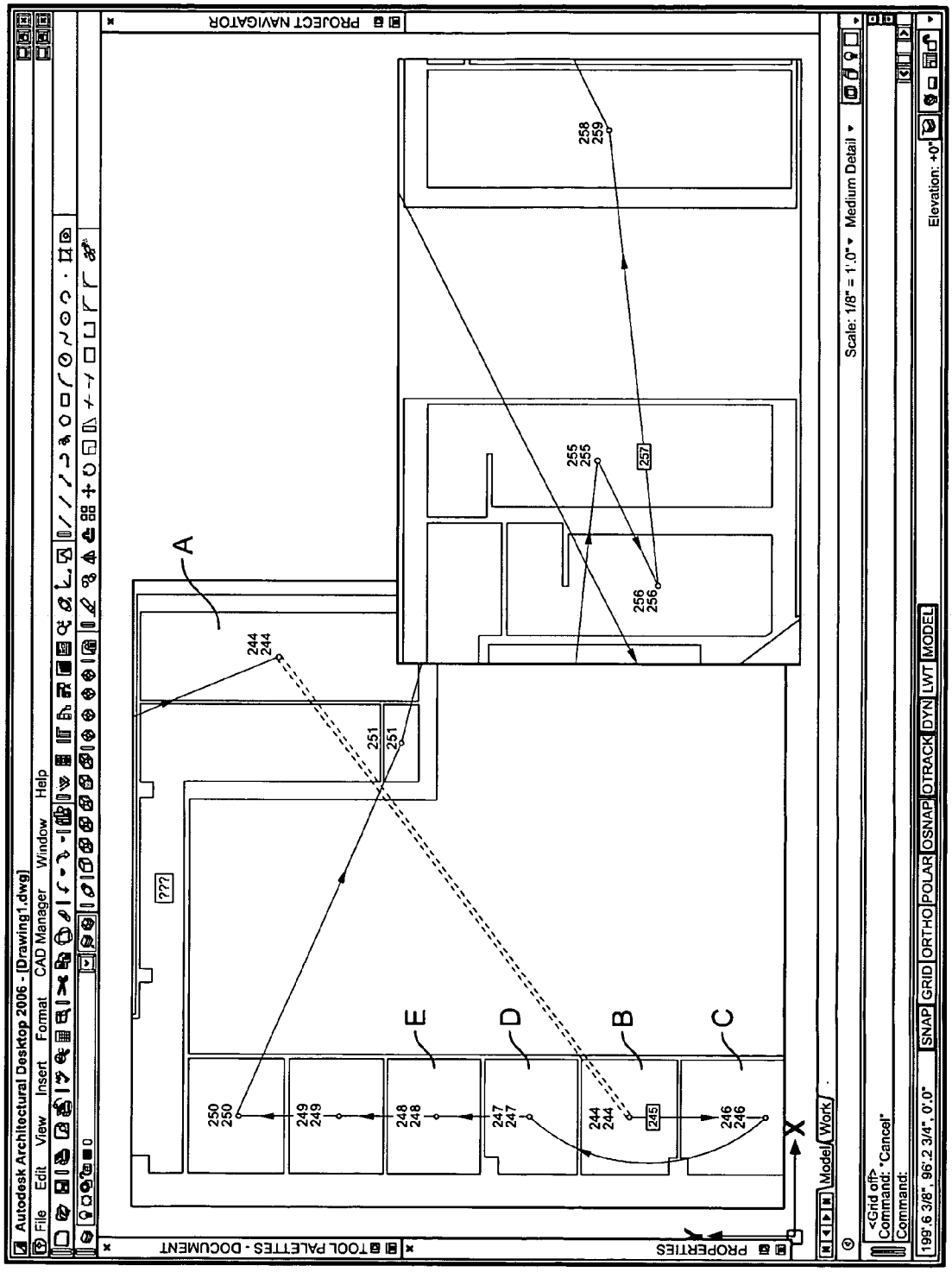
FIG. 3 illustrates data values associated with graphical objects generated responsive to parameters defined in the palette shown in FIG. 2.

Through assigned data values and directional links, reordering graphical objects can be realized. However, as new objects are continuously created, and existing graphical objects are deleted or constantly modified in a manner demanded by a particular design, it is possible that two or more objects are assigned with an identical data value during the process of adding or deleting an object. As shown in FIG. 3, objects such as object "A" and object "B" are erroneously assigned with an identical data value (e.g., "244"). Accordingly, to accurately and efficiently identify graphical objects having an identical data value, in some implementations, the tracing technique can be configured, either by the user or the renumber tool, to locate identical data values, and display them using special graphical indicators. For example, the renumber tool can display a double-dash link between these graphical objects (e.g., between object "A" and object "B") to indicate that object "A" and object "B" have the same data value. Optionally, the directional link interconnecting the two objects having an identical data value can employ a unique graphical representation for identification. Other graphical links, other than the double-dash link, also can be utilized to achieve this identification. To reassign a new data value, the user may simply select one of the two objects (e.g., object "A" and object "B"), and manually alter the assigned data value (i.e., "244") of the selected object.

Once the inconsistency has been identified, an unassigned data value previously assigned to a deleted object can be used to resolve the inconsistency. The unassigned value may be stored upon deleting an object from the drawing, or determined when the renumber tool is activated. The unassigned value may then be accessed when an existing object requires a new data value. For example, if an object having a data value of "245" is deleted, the data value "245" becomes an unassigned value, and can be used again, for example, if two objects having an identical value of "244" are detected.

As described above, the renumber tool identifies the inconsistency between data values of object "A" and object "B", and detects that the data value "245" suitable to maintain the sequence between object "A" and object "B" is an unassigned data value. Accordingly, the unassigned data value "245" may be displayed to the user as a remedy to replace the assigned data value "244" of either object "A" or object "B". The user may simply select the unassigned value "245" displayed adjacent to the node of the object (e.g., node B) to effectuate this modification so as to update the originally assigned data value "244" of object "B" to a new data value of "245".

After removing the inconsistency and restoring the sequential order, the renumber tool may subsequently replace the double-dash link with a directional indicator indicating the sequence of the two objects. An unassigned data value also may be displayed using a graphical representation (e.g., color) different from that for an originally assigned data value so as to provide a graphical distinction there between.

In one implementation, if an unassigned data value is unavailable, to restore the sequence of object "A" and object "B", a user may hover and highlight an object or a node representing the object requiring a new data value, and manually modify the data value of the highlighted object. Upon executing the modification, the renumber tool may update all or a selected group of graphical objects whose data values succeed that of the highlighted object.

In another implementation, if the unassigned data value is unavailable, the user may manually assign a data value to the "inconsistent" object (e.g., a user can highlight object "B", and replace object B's data value "244" with the next data value in sequence; namely, "246"). If the manually assigned data value is itself already assigned (data value "246" has been already assigned to object "C", a new data value may be necessary for object "C"), the renumber tool can progress sequentially through each succeeding object (old objects 246 and up), and modify the object's originally assigned data values until the sequence is fully restored. Based on the start value and incremental value previously defined (e.g., in the palette 201), each subsequent value may be replaced by applying the specified incremental value to a preceding value so that each succeeding object is allocated with a new data value conforming to a desired sequence. For example, if the incremental value has been set to "2", upon modifying the data value "244" of object "B" to data value "246", the renumber tool replaces the data values of successive objects "C" and "D" with respective data values of "248" and "250".

While the foregoing reordering process may be applied to every data value (e.g., "246", "247" and "248") succeeding that of the highlighted object (i.e., "244"), this recursive method may automatically terminate if it is determined that the sequence to the data values of the selected group of objects has been restored.

It should be understood that graphical objects having preceding data values (e.g., "242", "243" and "244") may not be affected by the new data value ("246") of the highlighted object. Therefore, the reordering process as described above may not be applicable to the preceding values. Accordingly, in some implementations, the renumber tool may forego analyzing graphical objects having data values preceding that of the highlighted object whose data value is modified so as to expedite the reordering process. Optionally, the renumber tool can analyze either only the preceding data values, or both the preceding and succeeding data values in a manner suitable for a particular application and design.

To modify a data value of a particular object, the user may simply select either by hovering and highlighting the object, or drawing a box around the object, or otherwise select a given object. In response, the renumber tool may automatically reorder, if necessary, all data values succeeding that of the modified object to ensure that the specified sequence is maintained. Alternatively, the user may choose to simply click on the node of the object or other graphics control, such as nodes, as will be discussed in greater details below, to activate the reordering process.

Locking a Data Value

Figure 4:
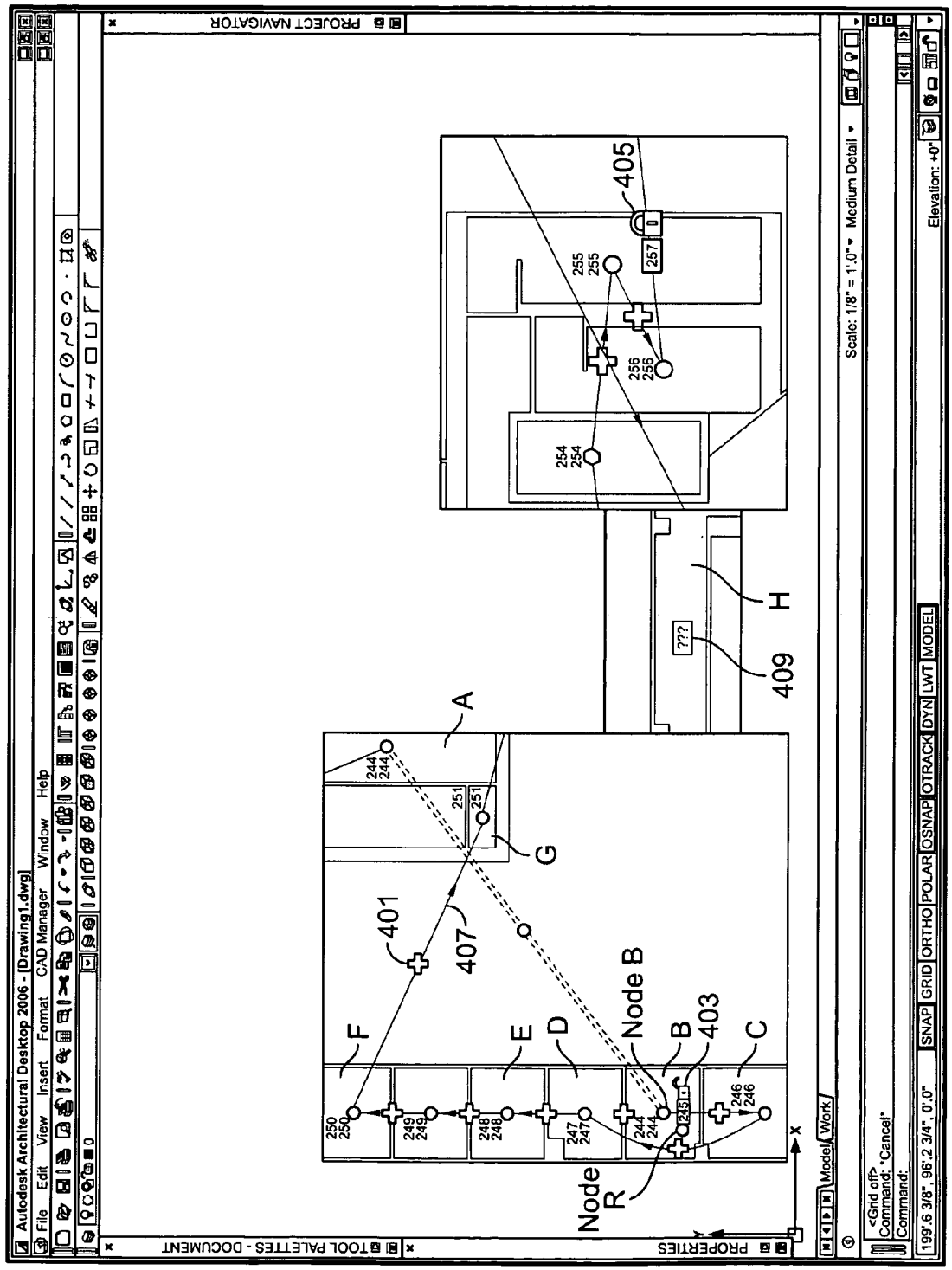
FIG. 4 illustrates exemplary data values of graphical objects.

Referring to FIG. 4, object "B" includes node B functionally representing object "B", node R and a graphical lock 403 or other means to indicate a control to initiate a lock. As described above, if it is determined that the unassigned data value "245" is available, the renumber tool can display this unassigned data value to the user as an option to replace the originally assigned data value "244". To activate this option, in one implementation, node R is displayed by the renumber tool as a shortcut for the user, which when selected will dynamically implement the change. Other suitable graphics control, other than the node scheme, also can be employed.

As discussed above, if an inconsistency between the data values of the objects is identified, an unassigned data value previously assigned to a deleted object can be used to resolve the inconsistency. The unassigned value may be stored upon deleting an object from the drawing, and accessed when an existing object requires a new data value. In some implementations, locks can be used to retain unassigned data values for future use and prohibit their automatic selection. For example, if the unassigned data value "245" is not implemented by object "B" but yet should be secured from being used by other objects, for example, when an object has been removed from the drawing but still needs to preserve identification in another document, the user may lock the unassigned data value "245" using, for example, the graphical lock 403. A locked unassigned value becomes inaccessible. In one implementation, the graphical lock 403 can be released by the user by simply clicking on the graphical lock 403 or the unassigned data value "245".

In another implementation, a graphical lock also may be used to lock an unassigned data value for an object that has yet to be added. For example, the unassigned data value "257" may be locked and reserved by graphical lock 405. Graphical lock 405 may be displayed along with the unassigned data value "257" in an area where a new object may be added. To release a locked data value, the user may, for example, manually click on graphical lock 405 again, and select node R in the manner previously discussed to implement the unassigned data value. In some implementations, if one or more locks are utilized, each lock can be graphically represented using a unique graphical representation (e.g., different color, size, etc.) to distinguish between each lock.

Inserting Objects into a Pre-Existing Sequence

In some implementations, a newly added object or object that does not have the selected property set applied (although it can be applied) is displayed. This is shown in FIG. 4. Object "H" is an example of a Space object that has not had the number property from the RoomObjects property set applied, and to prompt the user, a series of question marks are shown where a data value for the number property would normally be displayed.

An example shall be described where the user would like to give the Object "H" a data value of "251", that is, to insert the Object "H" into a particular point in a preexisting sequence. In this implementation, the user can select a displayed icon (or "grip") 401 linked between the two data values "250" and "251" to select the insertion point within the sequence. The user then selects the Object "H", and the data value "251" is automatically assigned to Object "H". Alternatively, the renumber tool can be configured to select the smaller data value (i.e., 250), and assign object "H" with this smaller data value. The user can continue to apply the next value in the sequence to other objects that do not contain the specified property (or to objects that already have the specified property but without a data value if no default value was assigned) by sequentially selecting each object until user input to end the renumbering operation is received. Alternatively, the renumber tool can automatically update the data values assigned to succeeding objects in the sequence according to the preselected incremental value. That is, the object formerly assigned "251" can be assigned "252", etc. until the sequence is restored.

Swapping Data Values Between Objects

While implementations related to assigning, inserting, modifying, storing or locking a new, unassigned or existing data value have been shown, in yet another implementation, if the sequence of the data values requires merely swapping the data values of two graphical objects, the present method provides a switching function for performing value switching between two distinct graphical objects.

As readily shown in FIG. 4, the icon 401 is activated when directional link 407 connecting object "F" and object "G" is selected. The user may instruct the renumber tool to trade the assigned data values of object "F" and object "G" connected by directional link 407. For example, the user may click on icon 401, with or without using click modifiers such as the 'Ctrl' key, to trade the originally assigned data values of object "F" and object "G". As a result, object "F" is now assigned a new data value of "251", and object "G" is assigned a new data value of "250".

Reorder Process for a New Object

Figure 5:
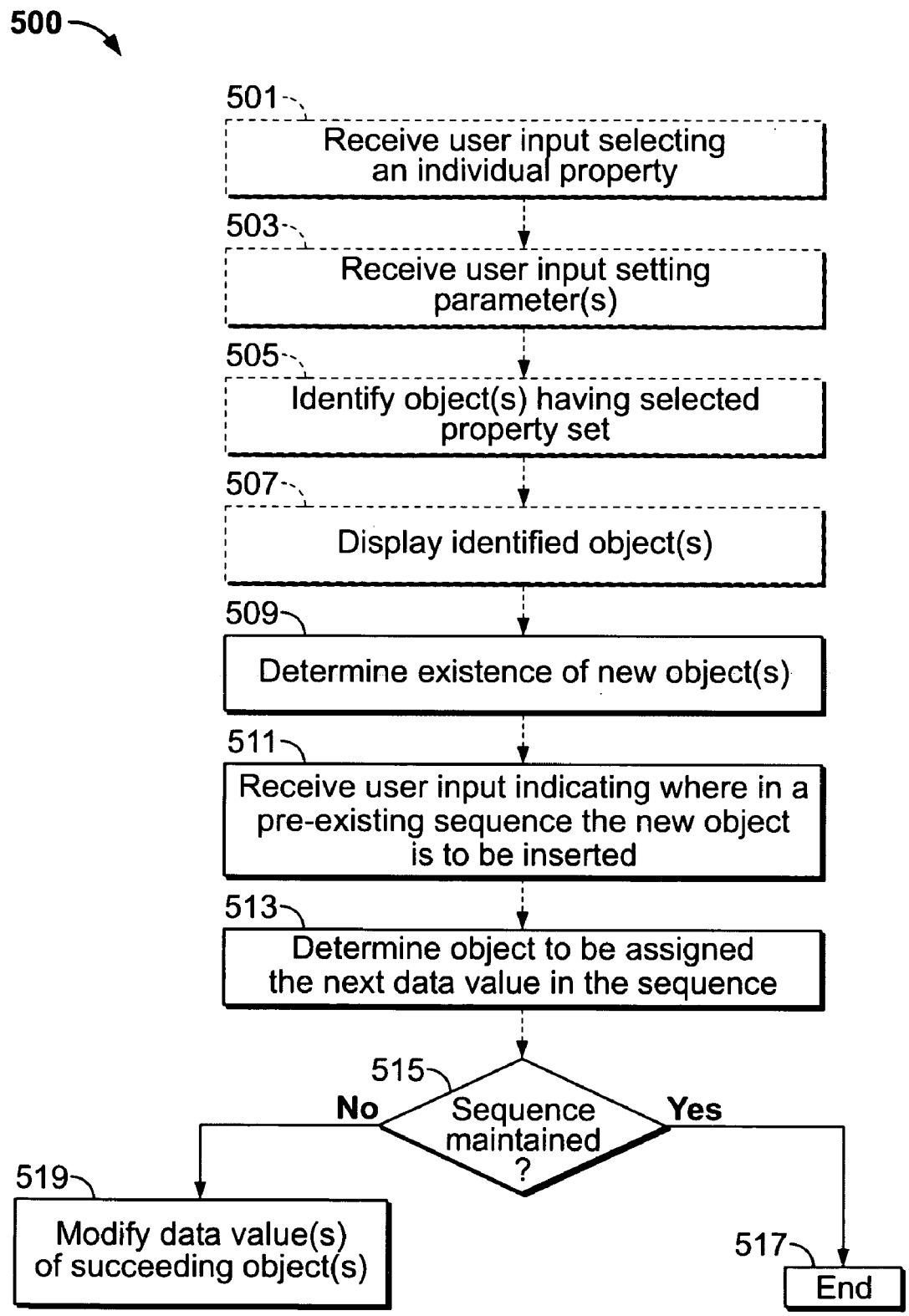
FIGS. 5-7 are flowcharts each illustrating an exemplary reordering process.

FIG. 5 is a flow diagram illustrating an exemplary reordering process 500. User input is received selecting an individual property (Step 501). Further user input can be received specifying initial parameters associated with reordering objects, such as a start value, incremental value, text height, and node size (Step 503). Based on the user input, one or more graphical objects having the selected property can be identified (Step 505). The identified graphical objects are then displayed while other graphical objects are hidden (Step 507). Alternatively, all graphical objects can be displayed, but the identified graphical objects can be visually differentiated, e.g., by highlighting or use of a different color.

A determination is made as to whether a new object has been added (Step 509) or whether a new object contains a specified property. The determination can be performed by the user or the software executing process 500. After determination, if a new object exists without the specified property, user input can be received specifying where in the pre-existing sequence (e.g., one that conforms to the existing objects) the new object is to be inserted (Step 511). Once the new object is inserted into the sequence, determination is made with respect to an object that will be assigned the next data value succeeding that of the new object in the sequence (Step 513).

In some implementations, the renumber tool can determine if a data value has been reserved for the new object. If a reserved data value is found, the renumber tool can apply the reserved data value automatically to the new object so that user input is not required. If no reserved data value is found, then a new data value can be randomly assigned or manually generated to the new object. Once a data value is determined and assigned to the new object, the renumber tool can analyze all data values and verify whether the sequence previously specified is maintained (Step 515).

If all data values remain in sequence ("Yes" branch of step 515), the renumber tool can prompt the user to determine whether the reordering process should be terminated (Step 517). Optionally, the renumber tool can store or discard any change to any data value. Alternatively, if the sequence is inconsistent ("No" branch of step 515), the renumber tool can modify the preceding or succeeding data values of the graphical objects preceding or succeeding that of the new object so as to conform to the parameters or sequence specified at step 503 (Step 519). In some implementations, if at least one data value of an object is out of sequence, step 519 is executed.

In some implementations, operations 501, 503, 505, 507, 509, 511 and 513 may be performed in the order listed, in parallel (e.g., by the same or a different process, substantially or otherwise non-serially), or in reverse order to achieve the same result. For example, user input setting parameters (Step 503) may be received prior to receiving user input for selecting property set and property (Step 501). As another example, after receiving user input (501 and 503), existence of new object can be determined (Step 509) prior to identifying (Step 505) and display (Step 507) objects having the property set selected at Step 501. As yet another example, the renumber tool may determine and assign a data value to a new object (Step 513) based on the received user input indicating where the new object is to be inserted into the pre-existing sequence (Step 511) prior to receiving user input selecting property set and property (Step 501) or setting parameter(s) (Step 503).

In other implementations, if a previous reordering process has been performed, operations 501, 503, 505 and 507 can be omitted. In yet other implementations, process 500 can forego operation 501, 505, 507 and 511, or combinations thereof. In yet other implementations, any of the operations 501-519 may be performed by two or more entities rather than by a single entity.

Reorder Process Associated with Existing Objects

A set of graphical objects including data values ordered according to a sequence may have the sequence interrupted upon modifying of one or more of the graphical objects in the set. The modifying can include modifying a location of one or more objects within the design, and/or modifying the data values of one or more graphical objects. For example, among objects "A", "B", "C" and "D" sequentially and respectively numbered 1 through 4, a user may move object "A" to where object "D" was positioned, and object "D" to where object "A" was positioned, resulting in a sequence of 4, 2, 3, 1 corresponding to objects "D", "B", "C" and "A". The user may now desire to renumber the objects such that the sequence is restored. In this example, the sequence has a start value of "1" and an increment value of "1".

Figure 6:
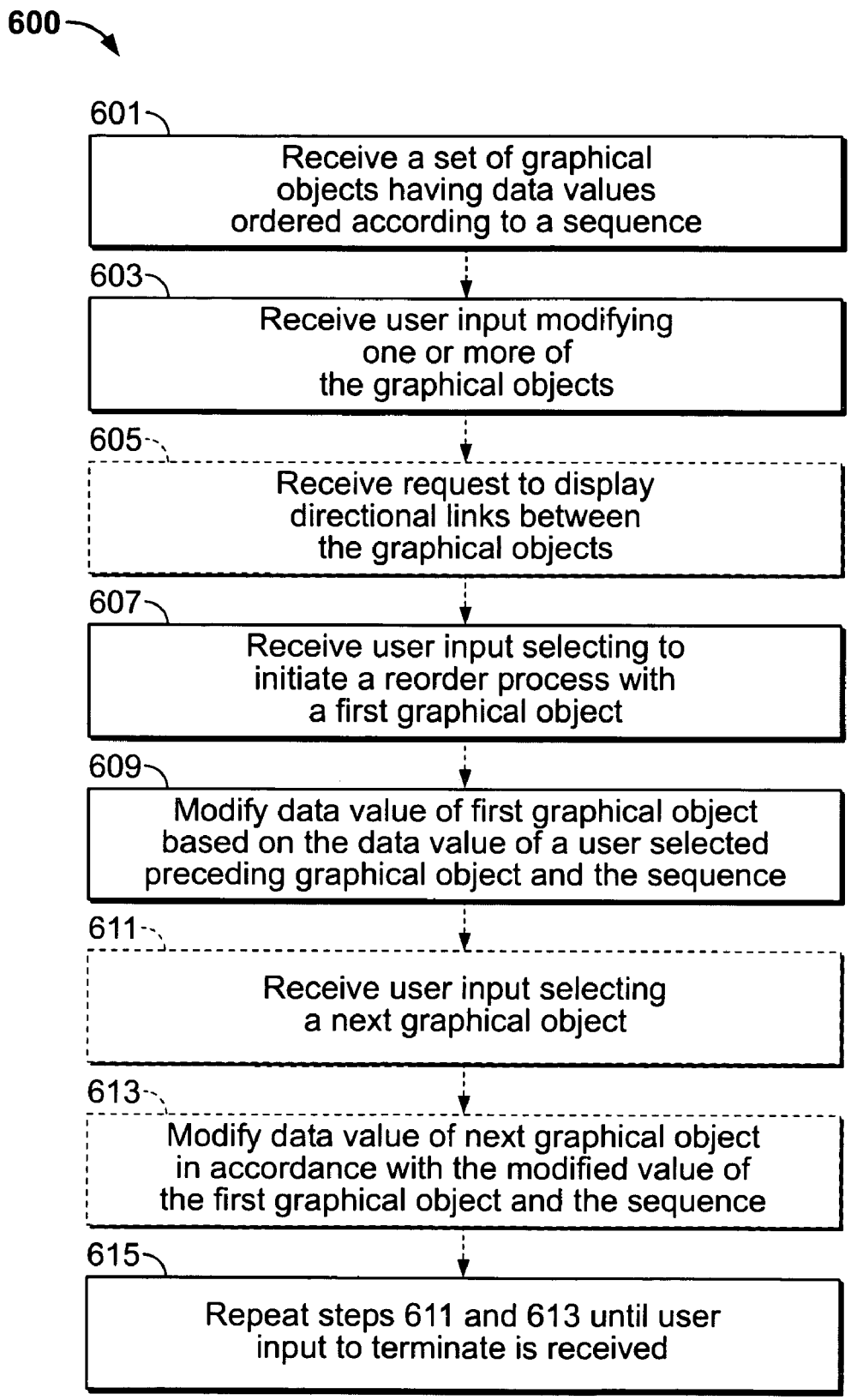

FIG. 6 illustrates a flow diagram illustrating an exemplary reordering process 600. A set of graphical objects having data values ordered according to a predetermined sequence is received (e.g., the set of graphical objects A-D having data values 1-4) (Step 601). User input modifying one or more of the graphical objects is received (Step 603). For example, modifying one or more of the graphical objects may include re-positioning one or more objects and/or changing the data value of one or more the objects. Optionally, a request to display directional links between the set of objects can be received for visually identifying the set of objects and providing graphical user controls, e.g., a grip located on a link between two graphical objects, to facilitate the receipt of additional user input (Step 605). The renumber tool receives a user input selecting to initiate a reorder process beginning with a user selected graphical object (the "first graphical object") (Step 607).

In order for the renumber tool to determine a data value to assign to the first graphical object, the renumber tool receives information from the user about the insertion point within the sequence. In one implementation, the information about the insertion point is a user input selecting a preceding graphical object in the sequence. Based on the user selected preceding graphical object and the sequence (i.e., the start value and increment value), the renumber tool can modify the data value of the first graphical object (Step 609). In another implementation, for example, where a directional link between sequential graphical objects is displayed including a grip to identify an insertion point, the user can select the grip. The renumber tool therefore knows to modify the data value of the first graphical object so as to be inserted into the sequence after the data value assigned to one of the corresponding linked objects, and modifies the data value of the first graphical object (Step 609). If the sequence has yet to be restored, a user input selecting a next graphical object (Step 611) in the reordering process can be received. The data value of the next graphical object can be modified based on the modified value of the first graphical object and the predetermined sequence (Step 613). Steps 611 and 613 can be repeated until the user terminates the reordering process (Step 615).

In some implementations, operations 601-615 may be performed in the order listed, in parallel (e.g., by the same or a different process, substantially or otherwise non-serially), or in another order to achieve the same result.

Reorder Process Associated with Deletion of an Object

Figure 7:
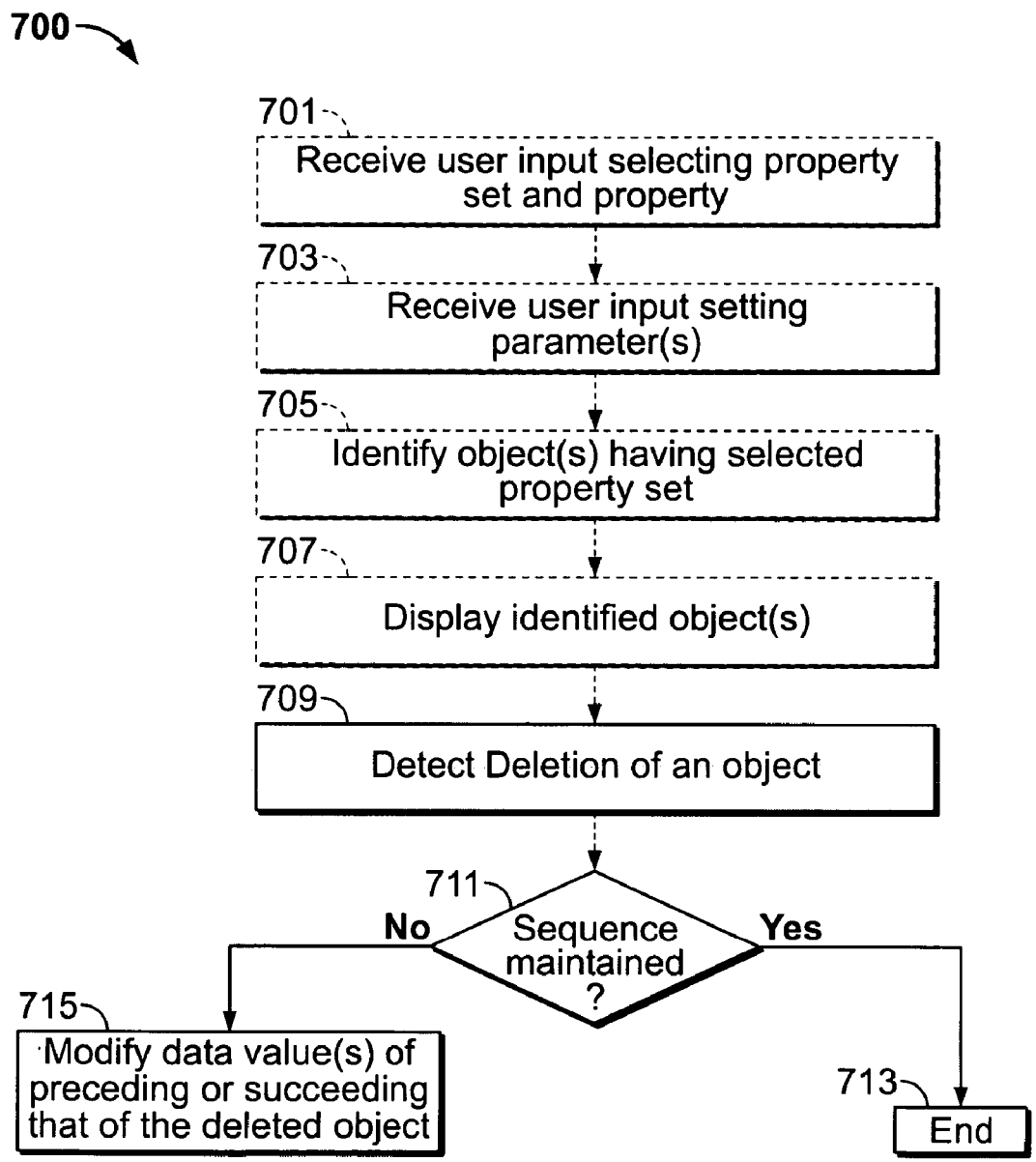

FIG. 7 is a flow diagram illustrating another exemplary reordering process 700. Similar to those discussed with respect to FIG. 5 and FIG. 6, user input is received selecting a property set and a property (Step 701). Further user input can be received specifying initial parameters associated with reordering objects, such as a start value, incremental value, text height, and node size (Step 703). Based on the user input, one or more graphical objects having or having the potential to have the selected property can be identified (Step 705). The identified graphical objects are then displayed while other graphical objects are hidden (Step 707). Alternatively, all graphical objects can be displayed, but the identified graphical objects can be visually differentiated, e.g., by highlighting or use of a different color.

A determination is made as to whether an existing object has been deleted (Step 709). In some implementations, the determination can be performed by the user or the software executing process 700. In other implementation, the determination is performed by analyzing the data values of the objects identified in step 705. After detection, if all data values remain in sequence ("Yes" branch of step 711), the renumber tool can prompt the user to determine whether the reordering process should be terminated (Step 517). Optionally, the renumber tool can store or discard any change to any data value. Alternatively, if the sequence is inconsistent ("No" branch of step 711), the renumber tool can modify the preceding or succeeding data values of the graphical objects preceding or succeeding that of the deleted object so as to conform to the parameters or sequence specified at step 703, either upon user request or automatically (Step 715). In some implementations, if at least one data value of an object is out of sequence, step 715 is executed.

General

In one implementation, the reordering process according to the present invention may be implemented in software as an enhancement to the AutoCAD®, Autodesk Architectural Desktop® or Autodesk Building Systems® software programs sold by Autodesk, Inc., the assignee of the present invention. Those skilled in the art will recognize that the present invention is applicable to other computer programs and electronic applications as well.

As described above, the reordering tool can be implemented in software, firmware and/or hardware. In one implementation, the reordering tool is a tool executing in a CAD software application and provides a user interface for receiving input from a user. The input can be transformed into one or more of the data structures described herein that can be used to implement the reordering features described herein. The renumber tool can provide one or more controls in the user interface for receiving user interaction, for example, dialog boxes or menu palettes for receiving user selections.

Also, the above description of techniques is only illustrative of one implementation, and other techniques can be used to implement the reordering process. In one implementation, the data values and graphical objects are configured to be included in a .DWG or .DXF (Document eXchange Format). These file formats may be compatible with CAD software such as AutoCAD available from Autodesk, Inc. of San Rafael, Calif.

Further, the present invention may be implemented on a computer system suitable to be programmed with programming instructions implementing a CAD system. The computer system may be a Pentium-based operating system including Microsoft Windows®.

In another implementation, the present invention can be executed using a personal computer or workstation, which generally includes a processor, random access memory, data storage units (e.g., hard drive, floppy drive, flash memory, CD/CD recordable-ROM drive and/or DVD/DVD recordable ROM drive), data communication units (e.g., universal serial bus, modem, network interface and wireless interface), display unit (e.g., a CRT (cathode ray tube) or LCD (liquid crystal display) monitor) for displaying information to the user, and user input units (e.g., keyboard, mouse and pointing device) by which the user can provide input to the computer.

Implementations of the present invention and all of the functional operations described in this specification can be implemented in digital electronic circuitry, or in computer software, firmware, or hardware. Implementations of the present invention can be implemented as one or more computer program products (i.e., one or more modules of computer program instructions encoded on a computer-readable medium including, but not limited to, a machine-readable storage device, a machine-readable storage medium, a memory device, or a machine-readable propagated signal, for execution by data processing apparatus). In addition to encompassing all apparatus, devices, and machines for processing data, the apparatus can further include code that creates an execution environment for the computer program (e.g., code that constitutes processor firmware, a protocol stack, a database management system, an operating system, or a combination thereof).

The present invention can be written in any form of programming language, including compiled or interpreted languages, and it can be deployed in any form, including as a stand-alone program or as a module, component, subroutine, or other unit suitable for use in a computing environment. The present invention does not necessarily correspond to a file in a file system. The present invention can be stored in a portion of a file that holds other programs or data (e.g., one or more scripts stored in a markup language document), in a single file dedicated to the program in question, or in multiple coordinated files (e.g., files that store one or more modules, subprograms, or portions of code). The present invention can be deployed to be executed on one computer or on multiple computers that are located at one site or distributed across multiple sites and interconnected by a communication network.

The processes and logic flows described in FIGS. 5-7 of the specification can be performed by one or more programmable processors executing one or more computer programs to perform functions by operating on input data and generating output.

Processors suitable for the execution of the present invention include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks). However, a computer need not have such devices.

The present invention may use computers to assist in the design and testing of parts for a variety of applications. The present invention may be equipped with efficient computer equivalents of many common drawing and drafting tools, thus liberating the user from countless tedious drafting details.

It should be appreciated by those skilled in the relevant art that the drawing shown in FIGS. 1-4 may include many more CAD graphical objects than the ones already shown because the drawing may have numerous views, numerous designs, and numerous drawing sheets. However, for ease of understanding the implementations of the present invention, a limited number of views and designs are utilized. Nevertheless, they sufficiently illustrate the present invention.

A number of implementations of the present invention have been described, and it should be understood that various modifications may be made without departing from the spirit and scope of the invention. For example, the steps performed in FIGS. 5-7 are descriptive of the operations performed by either the renumber tool or a user, and are arbitrary. In practice, the order in which these steps are taken is random depending on a particular application. Each of the described steps may be performed separately, in combination with, or in any order, with respect to any of the other steps.

What is claimed is:

1. A computer-implemented method, comprising:
   drawing a plurality of first graphical objects in a computer-aided design, the first graphical objects being in an ordered sequence where the ordered sequence is based on existing values of a data property that is common to the first graphical objects, the common data property of at least one of the first graphical objects being locked;
   displaying a directional link from each first graphical object to an other first graphical object where the other first graphical object has a data property value that is equal to or a next greater than value of the first graphical object's data property;
   receiving one or more commands, the one or more commands affecting the ordered sequence of the first graphical objects;
   in response to the receiving:
      identifying one or more second graphical objects in the first graphical objects where the data property of each of the second graphical objects is unlocked and requires updating;
      reordering the plurality of first graphical objects into a new ordered sequence, the reordering comprising assigning a distinct new value to the common data property of each of the second graphical objects;
      redrawing the one or more directional links such that the directional links connect first graphical objects that are adjacent to each other in the new ordered sequence, the directional links arranged to avoid completely overlying one another; and
      drawing one or more non-directional links linking graphical objects whose common data property has identical data values in the new ordered sequence as a result of the assigning new values, wherein each of the directional links and the non-directional links is capable of receiving one or more new commands, the one or more new commands affecting the new ordered sequence.

2. The method of claim 1, wherein the ordered sequence increments by a predetermined incremental value.

3. The method of claim 1, wherein the common data property is specified interactively.

4. The method of claim 1, wherein the distinct new value is a saved value, the saved value being a value of a data property that belongs to a graphical object that has been deleted from the computer-aided design.

5. The method of claim 1, wherein the one or more commands comprises:
- selecting a directional link linking two graphical objects which are adjacent to each other in the ordered sequence; and
- swapping ordered positions of the two graphical objects.

6. A computer program product, tangibly stored on a computer-readable medium, the computer program product comprising instructions operable to cause a programmable processor to perform operations comprising:
- drawing a plurality of first graphical objects in a computer-aided design, the first graphical objects being in an ordered sequence where the ordered sequence is based on existing values of a data property that is common to the first graphical objects, the common data property of at least one of the first graphical objects being locked;
- displaying a directional link from each first graphical object to an other first graphical object where the other first graphical object has a data property value that is equal to or a next greater than value of the first graphical object's data property;
- receiving one or more commands, the one or more commands affecting the ordered sequence of the first graphical objects;
- in response to the receiving:
  - identifying one or more second graphical objects in the first graphical objects where the data property of each of the second graphical objects is unlocked and requires updating;
  - reordering the plurality of first graphical objects into a new ordered sequence, the reordering comprising assigning a distinct new value to the common data property of each of the second graphical objects;
  - redrawing the one or more directional links such that the directional links connect first graphical objects that are adjacent to each other in the new ordered sequence, the directional links arranged to avoid completely overlying one another; and
  - drawing one or more non-directional links linking graphical objects whose common data property has identical data values in the new ordered sequence as a result of the assigning new values, wherein each of the directional links and the non-directional links is capable of receiving one or more new commands, the one or more new commands affecting the new ordered sequence.

7. The computer program product of claim 6, wherein the ordered sequence increments by a predetermined incremental value.

8. The computer program product of claim 6, wherein the common data property is specified interactively.

9. The computer program product of claim 6, wherein the distinct new value is a saved value, the saved value being a value of a data property that belongs to a graphical object that has been deleted from the computer-aided design.

10. The computer program product of claim 6, wherein the one or more commands comprises:
- selecting a directional link linking two graphical objects which are adjacent to each other in the ordered sequence; and
- swapping ordered positions of the two graphical objects.

11. A system comprising:
- a display device; and
- one or more processors to perform operations comprising:
  - drawing a plurality of first graphical objects in a computer-aided design, the first graphical objects being in an ordered sequence where the ordered sequence is based on existing values of a data property that is common to the first graphical objects, the common data property of at least one of the first graphical objects being locked;
  - displaying a directional link from each first graphical object to an other first graphical object where the other first graphical object has a data property value that is equal to or a next greater than value of the first graphical object's data property;
  - receiving one or more commands, the one or more commands affecting the ordered sequence of the first graphical objects;
  - in response to the receiving:
    - identifying one or more second graphical objects in the first graphical objects where the data property of each of the second graphical objects is unlocked and requires updating;
    - reordering the plurality of first graphical objects into a new ordered sequence, the reordering comprising assigning a distinct new value to the common data property of each of the second graphical objects;
    - redrawing the one or more directional links such that the directional links connect first graphical objects that are adjacent to each other in the new ordered sequence, the directional links arranged to avoid completely overlying one another; and
    - drawing one or more non-directional links linking graphical objects whose common data property has identical data values in the new ordered sequence as a result of the assigning new values, wherein each of the directional links and the non-directional links is capable of receiving one or more new commands, the one or more new commands affecting the new ordered sequence.

12. The system of claim 11, wherein the ordered sequence increments by a predetermined incremental value.

13. The system of claim 11, wherein the common data property is specified interactively.

14. The system of claim 11, wherein the distinct new value is a saved value, the saved value being a value of a data property that belongs to a graphical object that has been deleted from the computer-aided design.

15. The system of claim 11, wherein the one or more commands comprises:
- selecting a directional link linking two graphical objects which are adjacent to each other in the ordered sequence; and
- swapping ordered positions of the two graphical objects.

* * * * *